(12) United States Patent
Bristol et al.

(10) Patent No.: US 7,374,867 B2
(45) Date of Patent: May 20, 2008

(54) ENHANCING PHOTORESIST PERFORMANCE USING ELECTRIC FIELDS

(75) Inventors: Robert Bristol, Portland, OR (US); Heidi Cao, Portland, OR (US); Manish Chandhok, Portland, OR (US); Robert Meagley, Hillsboro, OR (US); Vijayakumar S. Ramachandrarao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 473 days.

(21) Appl. No.: 10/679,816

(22) Filed: Oct. 6, 2003

(65) Prior Publication Data

US 2005/0074706 A1 Apr. 7, 2005

(51) Int. Cl.
*G03F 7/26* (2006.01)

(52) U.S. Cl. ...................................... 430/322

(58) Field of Classification Search ............... 430/311, 430/322, 296, 327
See application file for complete search history.

(56) References Cited

U.S. PATENT DOCUMENTS

| 5,158,861 | A |   | 10/1992 | Tokui et al. | 430/325 |
| 5,648,000 | A |   | 7/1997 | Yamazaki et al. |   |
| 5,783,362 | A |   | 7/1998 | Wakiya et al. |   |
| 6,103,145 | A |   | 8/2000 | Angelopoulos et al. |   |
| 6,225,215 | B1 | * | 5/2001 | Taravade et al. | 438/636 |
| 6,398,985 | B2 | * | 6/2002 | Yukinobu et al. | 252/514 |
| 2002/0046703 | A1 |   | 4/2002 | Templeton |   |
| 2003/0008246 | A1 | * | 1/2003 | Cheng et al. | 430/323 |
| 2003/0032302 | A1 | * | 2/2003 | Nishi et al. | 438/758 |
| 2004/0265739 | A1 | * | 12/2004 | Lin et al. | 430/270.1 |

FOREIGN PATENT DOCUMENTS

| JP | 57-32632 | 2/1982 |
| JP | 63-71842 | 4/1988 |
| JP | 63-244622 | 10/1988 |
| JP | 10-106930 | 4/1998 |
| TW | 499706 | 8/2002 |

OTHER PUBLICATIONS

Parlin, "The Torques and Forces Between Short Cylindrical Coils Carrying Alternating Curretns of Radio Frequency", Aug. 1923, Phys. Rev. 22, 193-197 (1932).*
"What is Alternating Current (AC)?: Basic Theory", www.allaboutcircuits.com, col. 2, chapter 1.*
Cheng et al., "Improving Resist Resolution and Sensitivity Via Electric-Field Enhanced Postexposure Baking", J. Vac. Sci. Technol. B 20(2), Mar./Apr. 2002.

* cited by examiner

*Primary Examiner*—Kathleen Duda
(74) *Attorney, Agent, or Firm*—Trop, Pruner & Hu, P.C.

(57) ABSTRACT

Electric fields may be advantageously used in various steps of photolithographic processes. For example, prior to the pre-exposure bake, photoresists that have been spun-on the wafer may be exposed to an electric field to orient aggregates or other components within the unexposed photoresist. By aligning these aggregates or other components with the electric field, line edge roughness may be reduced, for example in connection with 193 nanometer photoresist. Likewise, during exposure, electric fields may be applied through uniquely situated electrodes or using a radio frequency coil. In addition, electric fields may be applied at virtually any point in the photolithography process by depositing a conductive electrode, which is subsequently removed during development. Finally, electric fields may be applied during the developing process to improve line edge roughness.

10 Claims, 3 Drawing Sheets

ENHANCING PHOTORESIST PERFORMANCE USING ELECTRIC FIELDS

BACKGROUND

This invention relates generally to the patterning of photoresist.

Photoresist may be utilized to transfer a pattern from a mask to a semiconductor wafer in a repeatable fashion. Generally the process of photolithography involves a few basic steps. Initially, a photoresist is formed on top of the wafer by a spin-on process. Excess solvent is then removed in a pre-exposure bake. Thereafter, certain regions on the wafer are selectively exposed to radiation. Next, the wafer is baked in the so-called post-exposure bake. Then the wafer and, particularly, the photoresist is developed and rinsed. Regions that are exposed may either be resistant to removal or may be more prone to removal so that the pattern of a mask is transferred to the wafer in a repeatable fashion.

The quality of the pattern that is transferred from the photoresist to the underlying layer is based at least in part on what is call line edge roughness. The rougher the resulting lines transferred to the photoresist, the rougher the transfer in the pattern to the semiconductor wafer, which in turn may impact the performance of the device under fabrication.

Thus, it would be desirable to reduce the line edge roughness of the photoresist.

DETAILED DESCRIPTION

Figure 1:
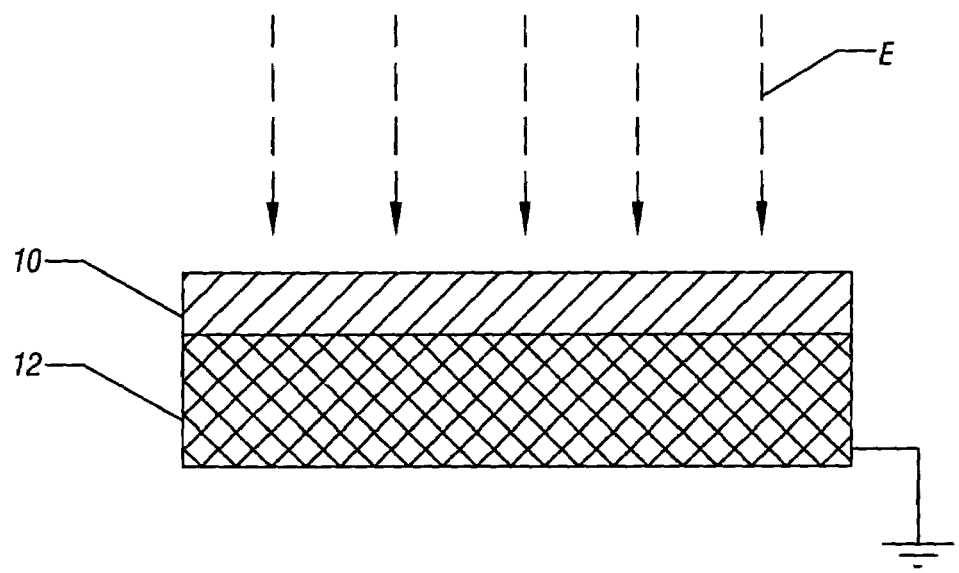
FIG. 1 is a schematic cross section of one embodiment of the present invention.

Referring to FIG. 1, a semiconductor substrate 12, such as a wafer covered by layers of other material, such as dielectric layers, may be covered by an unexposed, undeveloped photoresist 10. The photoresist 10 may be spun-on the substrate 12. In one embodiment, the substrate 12 may be grounded and the photoresist 12 may be exposed to an electric field indicated by arrows marked E.

In one embodiment, an electric field is applied before or during a pre-apply bake and may improve the distribution of polymers in the photoresist. The photoresist 12 may be a 193 nanometer or an extreme ultraviolet (EUV) photoresist which may be a blend of two polymers and/or a random copolymer containing both polar and non-polar components. The photoresist 12 may be a hydrogen-bonding polymer or copolymer, such as a poly(methylmethacrylate)-based or polyhydroxy styrene maleic anhydride and olefin-based block polymer.

The 193 nanometer photoresist may have aggregates randomly distributed in the resulting photoresist 12. These aggregates may contribute to the line edge roughness in some embodiments. The aggregates may be formed right after spin coating the photoresist 10 on the semiconductor substrate 12 irrespective of subsequent exposure and development processes. Further, the roughness of the photoresist 10 is transferred to the underlying substrate 12 in subsequent etch processes.

The aggregates may be denser than the bulk of the photoresist 10. The density of these aggregates may prevent their complete development, after exposure, by reducing the diffusivity/access of acids into the aggregates. One problem posed by these aggregates is their extension in both the lateral and vertical directions. In particular, the extension in the direction parallel to the surface of the substrate 12 may be a contributing cause of ine edge roughness in some cases.

One potential reason for the aggregates may be hydrogen bond formation between polar parts of the polymer chains forming the photoresist 10. Orienting the polar polymer chain elements in a more vertical direction, than in a horizontal direction, may reduce line edge roughness.

Figure 2:
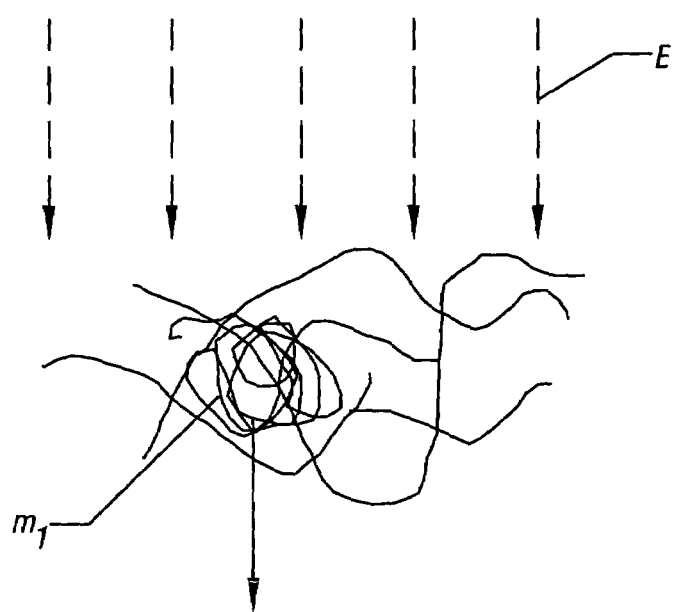
FIG. 2 is a schematic depiction of an aggregate exposed to the electric fields shown in FIG. 1.
Figure 3:
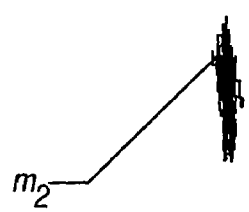
FIG. 3 is a schematic depiction of the effect of the electric field on the aggregate shown in FIG. 2.

Through exposure to an electric field, the aggregate M1 (FIG. 2) may become more aligned in the vertical direction, as indicated in FIG. 3, at M2 and compacted horizontally. As a result of this action on a large number of aggregates, molecules or elements of the photoresist 10, line edge roughness may be reduced.

Electric fields may be applied prior to exposure, before or during pre-exposure bake, when the photoresist 10 is above its glass transition temperature. This may be done by heating the photoresist film 10 or by solvent-induced depression of the glass transition temperature. Exposure to the electric field E shown in FIG. 1 may involve a photoresist 10 swollen with a non-polar solvent. Once the photoresist 10 has been oriented by the electric field, the solvent may be removed, for example by heating (pre-exposure bake) or other solvent removal techniques. This solvent removal may effectively "freeze" or make permanent the molecular vertical orientation. The orientation of the polymer molecules may occur during the pre-bake or before the pre-exposure bake. In one embodiment two pre-exposure bakes may be used: an initial bake to orient the polymers, and a second bake to remove the solvent.

The oriented photoresist 10 with the solvent removed is ready for exposure and development in a conventional lithographic process. These techniques may be particularly useful in connection with 193 mm or EUV photoresists that have aggregates.

The voltage of the electric field E used to orient the polymers or diblock copolymers that may form the photoresist 10 may be on the order of tens of volts in one embodiment. The distance between the electrodes that generate the electric field E may be on the order of one micrometer in one embodiment, resulting in long range order within the photoresist 10. The polymer film forming the photoresist 10 may be on the order of 200 nanometers thick with high electric fields in the polymer matrix on the order of $10^7$ to $10^8$ V/m as one example. For 193 nanometer line edge roughness reduction, the degree of ordering may be on the order of 5-20 nanometers horizontally, for example. The voltage to achieve such results may be on the order of less than ten volts but the distance of separation between the electrodes that apply the field and the semiconductor substrate 10 may on the order of a few millimeters where a 300 mm wafer is used to form the substrate 12.

Depending on the size of the wafer, a higher voltage on the order of tens to hundreds of volts may be utilized to maintain an equivalent electric field.

A potential benefit of applying an electric field during pre-exposure bake in some embodiments is that an applied oscillating potential may more evenly distribute the photo-acid generators in the resist, reducing one source of line edge roughness.

In another embodiment, an electric field may be applied during exposure. During exposure, the field may enhance photospeed in some embodiments by adding energy to the extreme ultraviolet-generated secondary electrons that may be responsible for activating the photoacid generators (PAGs). Photoresist with inherently low line edge roughness may be accelerated to acceptably fast photospeeds under exposure to an electric field. During exposure, the energy added to a liberated electron depends on the applied field strength and the distance traveled by the electron before it is re-absorbed or scattered. For a 5 nanometer scattering distance and 100 volts applied over 100 nanometer thickness, the extra energy is about 5 eV, which would be more than the original energy of the secondary electron.

Figure 4:
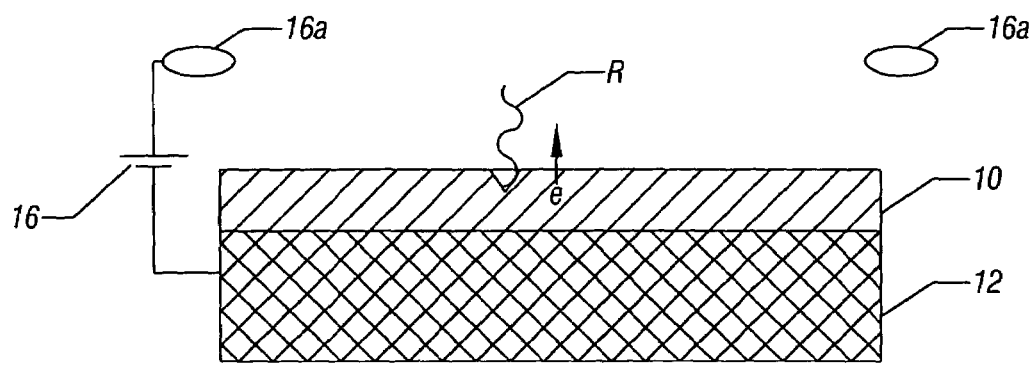
FIG. 4 is a schematic cross section of another embodiment of the present invention.

According to FIG. 4, chemically amplified extreme ultraviolet resist may be controlled using an applied voltage from a voltage source 16. In this case, the substrate 12 can be covered by a photoresist layer 10. A voltage potential is applied across the photoresist 10 during post-exposure bake, pre-exposure bake or possibly during exposure. The electrode 16a may be in the form of a ring, in one embodiment, to avoid obstructing the exposing radiation when the electrode 16a is used prior to exposure. Upon exposure to extreme ultraviolet radiation R, electrons e may be released. While a DC potential 16 is depicted, an AC source may also be used.

Figure 5:
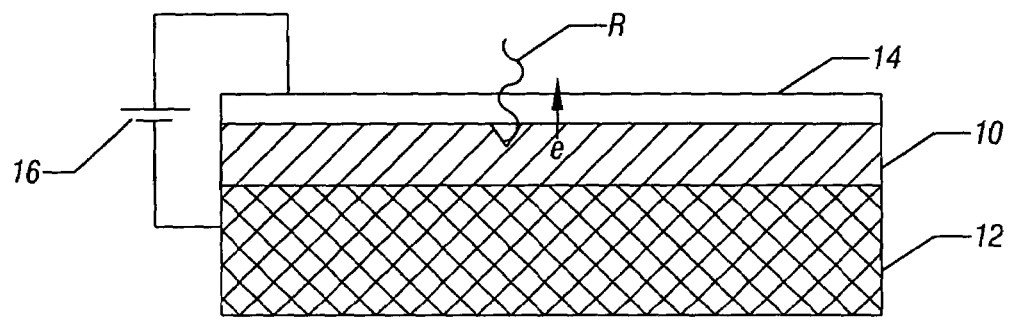
FIG. 5 is a schematic cross section of still another embodiment of the present invention.

In another embodiment, shown in FIG. 5, a thin layer of conductive material 14 may be applied over the resist 10 in order to apply the potential. Upon exposure to extreme ultraviolet radiation R, electrons e may be released. The conductive material 14 may be deposited, for example, by spin-on coating in one embodiment.

The material 14 may comprise a water-soluble conductive organic material, for example, a functionalized polythiophene. The material 14 may also comprise a conductive polymer, for example an onium sulfonate salt photoacid generator. In addition to onium sulfonate salts, the material 14 may also comprise acidic species, for example, ammonium sulfonate salts. The spun-on electrode material 14 may work with conventional resists. In one embodiment, the material 14 is water soluble so it may be washed away during the development stages.

Figure 6:
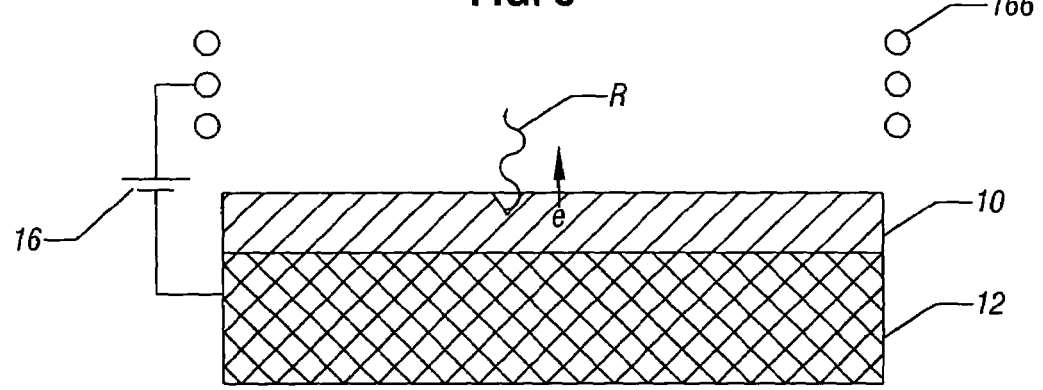
FIG. 6 is a cross section of yet another embodiment of the present invention.

Next, referring to FIG. 6, passing alternating current through a radio (or other) frequency coil 16b may enhance photospeed by adding energy to the extreme ultraviolet generated secondary electrons e. The coil 16b may induce the desired electric field without obstructing the exposure of the photoresist 10. Thus, the coil 16b may be used both before, after, and during exposure.

Figure 7:
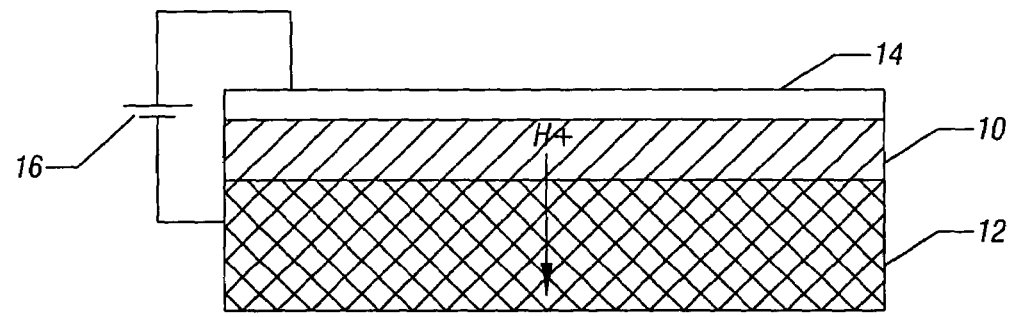
FIG. 7 is a cross section of still another embodiment of the present invention.

Referring to FIG. 7, an electric field may be applied to the conductive layer 14 during post-exposure bake. If sufficiently thin, the layer 14 may also be used prior to or during exposure.

Each of a low energy radio frequency coil 16b or electrode 16a may apply the potential to the photoresist without the use of a conductive material 14. The coil 16b or electrode 16a simplify the field exposure during post-exposure bake or pre-exposure bake.

Figure 8:
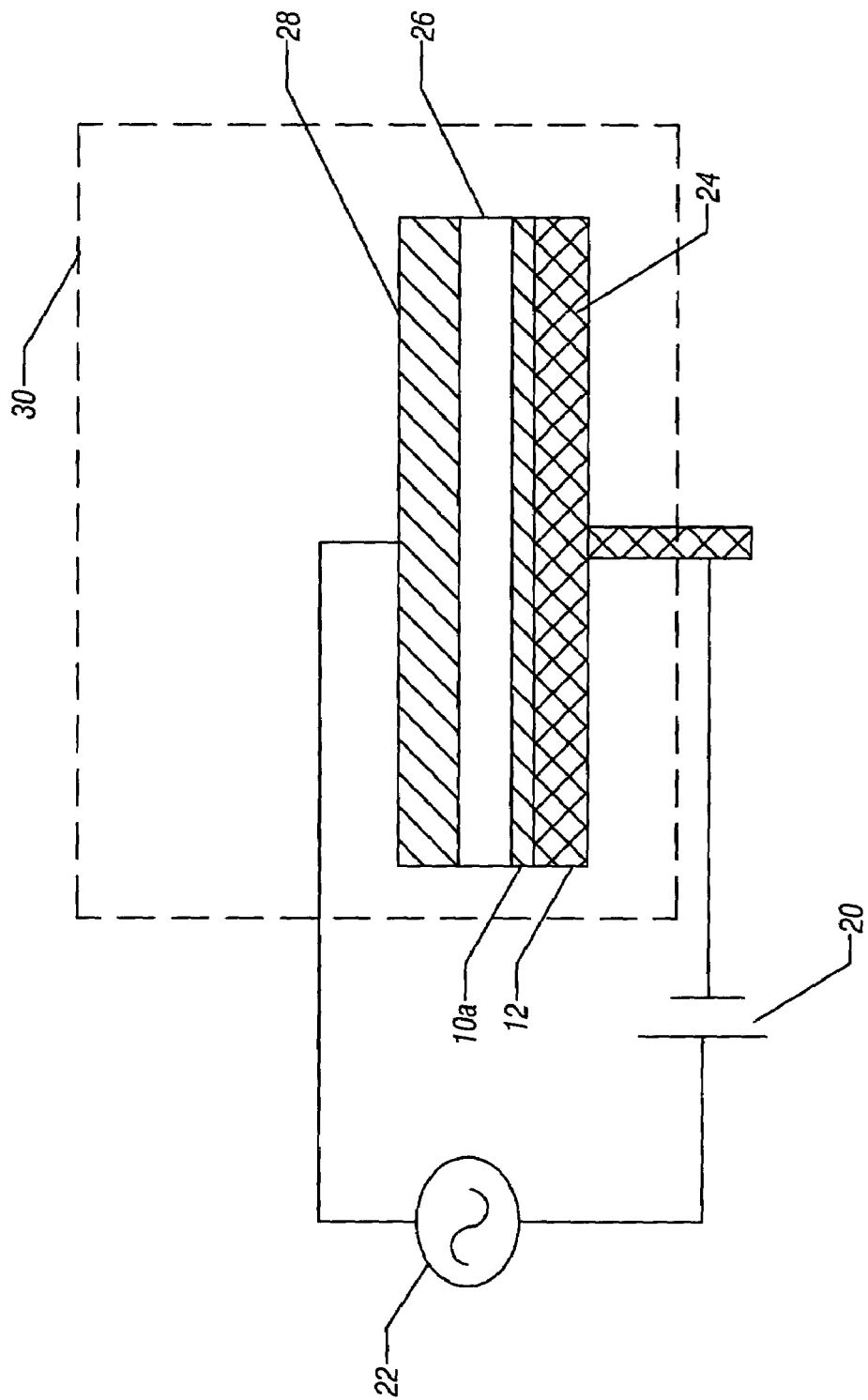
FIG. 8 is a schematic cross section of an apparatus in accordance with one embodiment of the present invention.

Thus, in one embodiment, the resist may be spun-on and exposed. Then the conductive material as shown in FIGS. 5 and 7 may be spun-on. Post-exposure bake of the wafer may be done with an applied potential as shown in FIGS. 6 and 8. Thereafter, the exposed structure may be developed and rinsed. Alternatively, a potential may be applied during exposure. In still another alternative, potential may be applied during pre-exposure bake. The potential may be applied during exposure or pre-exposure for example using the radio frequency applied field.

In another embodiment, electric fields may assist during development of photoresist. Removal of the exposed, baked photoresist by a developer may be by way of an electrochemical reaction. The reaction may occur between an negatively charged basic developer material, such as TMAH, and the polymer forming the photoresist, for example a phenolic compound with the diblocked polymer to be developed away. In the presence of an electric field, the local concentration of the developer hydroxyl ions is given by the Boltzmann distribution:

$$\rho(z)=\rho o \, \exp[eZ\Psi(z)/kT]$$

where $\rho o$ is the ion concentration at the top of the developer, e is the electron charge, Z is the valence of the ions, $\Psi(z)$ is the local potential, k is the Boltzmann's constant and T is temperature.

By adding an external potential V(operating system), the local density changes as:

$$\rho(z)=\rho o \, \exp[ez(\Psi(z)+V(z)kT]$$

allowing the developer concentration to be modified by the applied electric field.

Referring to FIG. 8, in accordance with another embodiment of the present invention, an exposed, undeveloped wafer W may be placed on a ground plane 12 and developer sprayed inside the development module 30 until a puddle is created. A powered electrode 28 is then placed on top of the puddle and an electric field is applied between the powered electrode 28 and the ground plane 12. A DC field (from DC potential 20) may result in a potential gradient between the top and bottom of the photoresist 26 positioned on the wafer 10. The resist development reaction rate is higher at the bottom of the photoresist 26, resulting in more vertical profiles and hence enhanced resolution.

An AC potential from the source 22 attracts negatively charged ions and the base developer solution closer to the bottom of the photoresist 26 when the ground plane is at a relatively positive potential. The AC potential attracts negatively charged ions to the top of the resist when the powered electrode is at a relatively positive potential. This results in more uniform distribution of developer ions, such as negatively charged ions, smoothing line edge roughness.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   depositing a conductive layer over photoresist to enable radiation to pass through said layer; and
   exposing said photoresist to an electric field using said layer.

2. The method of claim 1 including depositing a conductive material to form said layer and removing said layer after the photoresist is developed.

3. The method of claim 1 including spinning on said conductive layer.

4. The method of claim 1 wherein forming a conductive layer includes depositing a water soluble conductive material to act as said conductive electrode.

5. A method comprising:
exposing photoresist to radiation; and
while exposing said photoresist to radiation, exposing said photoresist to an electric field using an electrode with an opening to permit the passage of radiation.

6. The method of claim 5 including exposing said photoresist to an electric field using a radio frequency coil to induce said electric field.

7. The method of claim 5 including exposing the photoresist to extreme ultraviolet radiation.

8. A method comprising:
forming a conductive layer over photoresist;
exposing said photoresist to an electric field using said layer; and
depositing a conductive material to form said layer and removing said layer after the photoresist is developed.

9. A method comprising:
forming a conductive layer over photoresist by depositing a water soluble conductive material to act as said conductive electrode; and
exposing said photoresist to an electric field using said layer.

10. A method comprising:
exposing photoresist to radiation;
while exposing said photoresist to radiation, exposing said photoresist to an electric field; and
exposing said photoresist to radiation through an electrode which is thin enough to allow said radiation to pass.

* * * * *